United States Patent [19]

Bynum et al.

[11] Patent Number: 4,533,845
[45] Date of Patent: Aug. 6, 1985

[54] CURRENT LIMIT TECHNIQUE FOR MULTIPLE-EMITTER VERTICAL POWER TRANSISTOR

[75] Inventors: Byron G. Bynum; David L. Cave, both of Tempe, Ariz.

[73] Assignee: Motorola, Inc., Schaumburg, Ill.

[21] Appl. No.: 582,360

[22] Filed: Feb. 22, 1984

[51] Int. Cl.³ .......................... H03K 5/08; H03K 17/08
[52] U.S. Cl. ...................... 307/540; 307/254; 307/299 A; 307/300; 307/546
[58] Field of Search ........... 307/253, 254, 264, 299 A, 307/300, 546, 555, 562, 540

[56] References Cited

U.S. PATENT DOCUMENTS 3,845,405 10/1974 Leidich .............................. 307/300

Primary Examiner—John Zazworsky
Attorney, Agent, or Firm—Vincent B. Ingrassia

[57] ABSTRACT

Circuitry is provided for current limiting the output current of a power substrate PNP transistor comprised of a plurality of emitters (e.g. 260). A resistor is placed between a fraction of the plurality of emitters (e.g. 8) and a source of supply voltage. When the power device is turned on, the current is drawn through the resistor causing a voltage drop thereacross. This voltage drop is monitored and when it reaches a certain level, a control signal is generated which ultimately results in limiting the conducted current of the power transistor.

7 Claims, 1 Drawing Figure

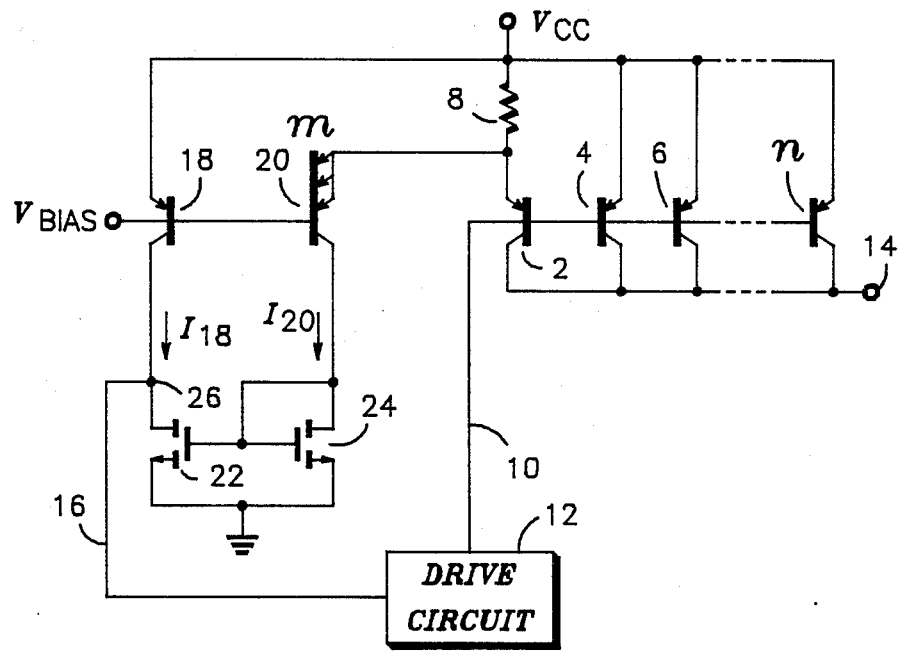

CURRENT LIMIT TECHNIQUE FOR MULTIPLE-EMITTER VERTICAL POWER TRANSISTOR

BACKGROUND OF THE INVENTION

This invention relates generally to current limiting circuitry and, more particularly, to circuitry for limiting the output current of a power substrate PNP transistor.

In most cases where it is necessary to provide means for limiting short circuit current, a resistor is placed in series with the power path (i.e. in series with the circuit's output), and the voltage across the resistor is monitored and compared with a reference voltage. This traditional approach, however, becomes extremely complicated in the case of a vertical substrate PNP device since the substrate or output voltage may swing over a wide range thus requiring that the current sensing circuitry have a very wide dynamic range.

An alternative approach is to sense the current flowing in the emitters of the power device by placing the resistor in series with the the total current. Unfortunately, if a low input-to-output voltage device is desired (i.e. approximately zero volts from the emitter to the collector when the device saturates), current flowing through the resistors in series with the emitters will result in a voltage drop, and the ability to achieve a low input-to-output voltage device will be lost.

SUMMARY OF THE INVENTION

It is an object of the present invention to provide improved current limiting circuitry.

It is a further object of the present invention to provide current limiting circuitry suitable for use in conjunction with integrated circuit technologies which utilize substrate output currents.

Yet another object of the present invention is to provide a current limiting technique for limiting the output current of a multiple emitter vertical power transistor.

A still further object of the present invention is to provide a current limiting circuit for use with a vertical PNP power transistor which has a low temperature coefficient, is not effected by base-width errors, is independent of common mode bias, does not degrade the power device's saturation characteristics and is reasonably insensitive to thermal gradients in the power device.

Accordingly to a broad aspect there is provided current limiting circuitry for a power transistor which includes a base, at least one collector and a plurality of emitters, comprising first impedance means coupled to only a fraction of the number of said plurality of emitters and a first source of supply voltage, said first impedance means having a value which is substantially different from any impedance in the remainder of said plurality of emitters; first means for turning the power transistor on and drawing a first current through the first impedance means which is related to the total current being conducted by the power transistor in a prescribed manner; and second means for monitoring the first voltage across the impedance means for limiting the first means when the voltage across the first impedance means reaches a certain level.

BRIEF DESCRIPTION OF THE DRAWING

The above and other objects, features and advantages of the present invention will be more clearly understood from the following detailed description taken in conjunction with the accompanying drawing which is a schematic diagram of the inventive current limiting circuitry.

DESCRIPTION OF THE PREFERRED EMBODIMENT

Referring to the drawing, a substrate power multi-emitter PNP device is shown functionally as comprising PNP transistors 2, 4, 6, . . . , n. In reality, the power device may typically include 260 emitters. As can be seen, each of the collectors of these devices are coupled together and in fact form the substrate of the device. Base drive is supplied to the power device by means of output 10 of drive circuit 12. That is, when the power device is to be turned on, current is pulled via line 10 from the base of transistor 2, 4, 6, . . . , n.

The current flowing to output terminal 14 may be measured by placing a sampling resistor in a fraction of the plurality of emitters which comprise a power device (e.g. in eight emitters). This is illustrated functionally by resistor 8 which is placed in the emitter path of PNP transistor 2. Thus, the amount of current flowing through the entire power device bears some relationship to the amount of the sample current flowing through resistor 8 when the power device is turned on. As current is pulled out of the base of the power device, the various emitters begin to turn on. Since the base-emitter voltage of transistor 2 is less than that of the remaining transistors due to the presence of resistor 8, the total current does not equal n times the current flowing in resistor 8 but is something less than that. The exact relationship will be given below.

Obviously, when the power device is turned on and current flows through the device, there will be a voltage drop across resistor 8. The remainder of the circuit to be described hereinbelow senses that voltage and generates an output at 16 which controls drive circuit 12 such that when the output current of the power device reaches a predetermined level, the signal appearing at 16 will cause drive circuit 12 to limit current from the base of the power device thus limiting the power device output current at terminal 14.

The comparing portion of the circuit comprises PNP transistor 18 and multi-emitter PNP transistor 20. Transistor 18 has an emitter coupled to $V_{CC}$ while the emitters of transistor 20 are coupled to the junction of resistor 8 and the emitter of transistor 2. A bias voltage $V_{bias}$ is applied to the base terminals of transistors 18 and 20 to maintain them on supplying arbitrary current magnitudes for $I_{18}$ and $I_{20}$.

The collectors of transistors 18 and 20 are coupled respectively to the drain electrodes of first and second N-channel field-effect-transistors 22 and 24. The gate electrodes are coupled together and to the drain of transistor 24, and the source electrodes of field-effect-transistors 22 and 24 are coupled to ground. Thus, transistors 22 and 24 are coupled in a current mirror configuration and with transistors 18 and 20 comprise a voltage comparator with input at the emitters of transistor 20. The mirror may be constructed to provide any desired ratio of currents; however, for the purposes of this discussion, a one-to-one ratio will be assumed. The output of the comparator circuit is taken from node 26 and is applied via line 16 to drive circuit 12.

Initially, when transistors 18 and 20 are turned on and transistors 2, 4, 6 . . . n are off, $I_{20}=mI_{18}$ where m is the number of emitters in transistor 20. Thus, transistor 22 will attempt to sink more current from node 26 ($I_{20}$) than is being supplied by the collector of transistor 18 ($I_{18}$), and the voltage at node 26 will drop. This low voltage applied via line 16 to drive circuit 12 will enable drive circuit 12 to pull current via line 10 from the base electrode of the power device. As current is drawn through resistor 8 a voltage drop will appear there across causing the voltage at the emitters of transistors 20 to decrease. As a result, $I_{20}$ will decrease. When the current flowing from the collector of transistor 20 equals or is less than the current flowing from the collector of transistor 18, the voltage at node 26 will rise. This rise in voltage when applied to drive circuit 12 will limit drive circuit 12 such that current from the base of the power device will not increase. Thus, current in the power device is limited to that current which causes a sufficient enough voltage drop in resistor 8 to cause the voltage at node 26 to rise.

It turns out, that the output current at terminal 14 at which the voltage at node 26 will switch may be described as follows:

$$I_{output} = \frac{(nm + 1)}{R_8} + V_T \ln m$$

where n is the number of emitters in the power device, m is the number of emitters in transistor 20, $R_8$ is the resistance of resistor 8, and $V_T$ is kT/q where k is Boltzman's constant, T is the absolute temperature and q is the charge on an electron.

This relationship can be derived as follows:

$$I_{R8}R_8 + V_{be2} = V_{be\ 4,\ 6,\ 8,\ \ldots,\ n}$$

where $I_{R8}$ is the current through resistor 8, $V_{be2}$ is the base-emitter voltage of transistor 2 and $V_{be\ 4,\ 6,\ 8,\ \ldots,\ n}$ is the base-emitter voltage of each of transistors 4, 6, 8, ..., n.

Thus, $$I_{R8} R_8 = V_T \ln \left( \frac{I_4 + I_6 + I_8 + \ldots I_n}{n\ I_2} \right)$$

where $I_2$, $I_4$, $I_6$, $I_8$ and $I_n$ are the currents through transistors 2, 4, 6, 8, ..., n respectively and the currents $I_4$, $I_6$, $I_8$, $I_n$ are equal in magnitude.

When $I_{18} = I_{20}$, $$\Delta V_{be} = V_{be18} - V_{be20} = V_T \ln m$$

where $V_{be18}$ and $V_{be20}$ are the base-emitter voltages of transistors 18 and 20 respectively.

When current limit is reached $$\Delta V_{be} = I_{R8} R_8$$

Therefore, $$I_{output} = \frac{(nm + 1)}{R_8} (V_T \ln m)$$

where $I_{output}$ is the sum of $I_2$, $I_4$, $I_6$, $I_8$ ... $I_n$ currents.

It should be appreciated that the above described circuit accurately senses output current without a lot of resistance in the emitters so that a low input-to-output voltage may be achieved. Further, the relatively few emitters containing resistor 8 may be distributed throughout the power device so as to minimize thermal error.

Further since the ratio n may be made large, the value of $R_8$ need not be extremely small. Small value resistors are difficult to fabricate in integrated circuit form. Finally since a voltage sense is done at the power device emitter, the dynamic (common mode) range of the comparator input need not be large. Also, the configuration of the current limit comparator allows operation over a very wide supply voltage range from as low as 1–2 volts.

The above description is given by way of example only. Changes in form and details may be made by one skilled in the art without departing from the scope of the invention as defined by the appended claims. For example, all PNP devices could be replaced by NPN or MOS devices and similarly all MOS devices could be replaced by bipolar devices. In addition, while no resistance has been shown in the remaining emitters of the power device, the circuit will work irrespective of this resistance as long as $R_8$ is substantially different from the resistance in the remaining emitters.

We claim:

1. Current limiting circuitry for a power transistor which includes a base, at least one collector and a plurality of emitters, comprising:

first impedance means having a first terminal coupled to only a fraction of the number of said plurality of emitters and a second terminal coupled to a first source of supply voltage, said first impedance means having a value which is substantially different from any impedance in the remainder of said plurality of emitters;

first means for turning said power transistor on and drawing a first current through said first impedance means which is related to the total current being conducted by said power transistor in a prescribed manner; and second means for monitoring the voltage across said first impedance means for limiting said first means when the voltage across said first impedance means reaches a certain level, said second means comprising a first transistor having base, emitter and collector terminals, said emitter being coupled to said second terminal of said first impedance means; a second transistor having base and collector terminals and the plurality of emitter terminals, each of said emitter terminals being coupled to said first terminal of said first impedance means, said first and second transistors having a base for coupling to a bias voltage which turns said first and second transistors and resulting in the generation of first and second currents respectively; and current mirror means coupled between a second source of supply voltage and said first and second transistors for generating a trigger when the voltage across said first impedance means reaches a certain level, said trigger being applied to said first means so as to limit current from said power transistor.

2. Circuitry according to claim 1 wherein said current mirror means comprises;

a first field-effect-transistor having a drain coupled to the collector of first transistor, a source for coupling to said second source of supply voltage and having a gate; and a second field effect transistor having a drain coupled to the collector of said second transistor and to the gate of said first field-effect-transistor, a gate coupled to the gate of said first field-effect-transistor and a source for coupling to said second source of supply voltage, the output trigger of said current mirror circuit being taken from the drain of said first field-effect-transistor.

3. Circuitry according to claim 2 wherein said first impedance means is a resistor.

4. Circuitry according to claim 3 wherein said power transistor is a vertical PNP power transistor.

5. Circuitry according to claim 4 wherein said first and second transistors are PNP transistors.

6. Circuitry according to claim 5 wherein said first and second field-effect-transistors are N-channel field-effect-transistors.

7. Circuitry according to claim 6 wherein said plurality of emitters comprises 260 emitters and wherein said first impedance means is coupled between 8 of said plurality of said emitters and said first source of supply voltage.

* * * * *